(12) United States Patent
Chien et al.

(10) Patent No.: US 11,397,378 B2
(45) Date of Patent: Jul. 26, 2022

(54) HEAT DISSIPATION DEVICE AND PROJECTOR

(71) Applicant: Coretronic Corporation, Hsin-Chu (TW)

(72) Inventors: Chao-Nan Chien, Hsin-Chu (TW); Yi-Han Lai, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 63 days.

(21) Appl. No.: 16/855,983

(22) Filed: Apr. 22, 2020

(65) Prior Publication Data
US 2020/0341356 A1    Oct. 29, 2020

(30) Foreign Application Priority Data

Apr. 29, 2019 (CN) .......................... 201920600683.2

(51) Int. Cl.
| | | |
|---|---|---|
| G03B 21/16 | (2006.01) | |
| H05K 7/20 | (2006.01) | |
| H04N 9/31 | (2006.01) | |

(52) U.S. Cl.
CPC ........... *G03B 21/16* (2013.01); *H04N 9/3144* (2013.01); *H05K 7/20409* (2013.01)

(58) Field of Classification Search
CPC .... G03B 21/16; G03B 21/145; H04N 9/3144; H05K 7/20409
See application file for complete search history.

(56) References Cited

U.S. PATENT DOCUMENTS

| | | | |
|---|---|---|---|
| 6,370,884 B1 * | 4/2002 | Kelada ................... | F25B 21/02 |
| | | | 62/3.3 |
| 6,878,952 B1 * | 4/2005 | Ohsono .................. | G21F 5/008 |
| | | | 250/507.1 |
| 7,497,013 B2 * | 3/2009 | Zaghlol ............... | H01L 21/4882 |
| | | | 165/185 |
| 7,500,757 B2 * | 3/2009 | Hashimoto ............ | G03B 21/16 |
| | | | 348/748 |
| 7,581,856 B2 | 9/2009 | Kang et al. | |
| 7,726,844 B2 | 6/2010 | Chen | |
| 7,819,173 B2 * | 10/2010 | Zaghlol ............... | H01L 21/4882 |
| | | | 165/80.3 |
| D634,278 S * | 3/2011 | Kharazmi .................... | D13/179 |
| 8,240,856 B2 * | 8/2012 | Yang ...................... | G03B 21/16 |
| | | | 353/57 |
| 9,664,986 B2 * | 5/2017 | Nouda .................... | G03B 21/16 |
| 2006/0197916 A1 * | 9/2006 | Hashimoto .......... | H04N 5/7416 |
| | | | 353/52 |

(Continued)

*Primary Examiner* — Bao-Luan Q Le
(74) *Attorney, Agent, or Firm* — JCIPRNET (57) ABSTRACT

The disclosure provides a heat dissipation device including a first fin structure and a heat conduction member. The first fin structure includes a first substrate and a plurality of first fins extending from the first substrate, the first fins include a plurality of first ends and a plurality of second ends. The plurality of first ends and the plurality of second ends are opposite to each other. The first ends are connected to the first substrate. The second ends are away from the first substrate, and the second ends contact the heat conduction member. The disclosure also provides a projector with the heat dissipation device. Through the heat dissipation device, the projector can achieve a good heat dissipation effect.

10 Claims, 12 Drawing Sheets

(56) References Cited

U.S. PATENT DOCUMENTS

| | | | | |
|---|---|---|---|---|
| 2006/0230616 A1* | 10/2006 | Zaghlol | ............... | H01L 21/4882 |
| | | | | 29/727 |
| 2007/0139887 A1* | 6/2007 | Lee | ........................ | G03B 21/16 |
| | | | | 361/700 |
| 2009/0178796 A1* | 7/2009 | Zaghlol | ............... | H01L 21/4882 |
| | | | | 165/185 |
| 2010/0053566 A1* | 3/2010 | Yang | .................... | H04N 9/3141 |
| | | | | 353/58 |
| 2010/0214736 A1* | 8/2010 | Zhang | ........................ | G06F 1/20 |
| | | | | 361/679.47 |
| 2010/0309671 A1* | 12/2010 | Meyer, IV | ............ | F21V 29/773 |
| | | | | 362/373 |
| 2013/0269920 A1* | 10/2013 | Taketomi | .................. | F28F 3/02 |
| | | | | 165/185 |
| 2015/0029726 A1* | 1/2015 | Leung | .................... | F21V 29/51 |
| | | | | 362/294 |
| 2015/0234263 A1* | 8/2015 | Yamagiwa | ......... | G02B 27/0101 |
| | | | | 359/630 |
| 2015/0345681 A1* | 12/2015 | Sodo | ........................ | F16L 33/24 |
| | | | | 285/351 |
| 2016/0004146 A1* | 1/2016 | Nouda | .................... | G03B 21/16 |
| | | | | 353/61 |
| 2016/0066476 A1* | 3/2016 | Gu | ............................ | F28F 3/02 |
| | | | | 361/715 |
| 2019/0309994 A1* | 10/2019 | Longsworth | ............... | F25B 9/14 |

* cited by examiner

HEAT DISSIPATION DEVICE AND PROJECTOR

CROSS-REFERENCE TO RELATED APPLICATION

This application claims the priority benefit of China application serial no. 201920600683.2, filed on Apr. 29, 2019. The entirety of the above-mentioned patent application is hereby incorporated by reference herein and made a part of this specification.

BACKGROUND OF THE INVENTION

1. Field of the Disclosure

The disclosure relates to a heat dissipation device and a projector and particularly relates to a heat dissipation device and a projector with a good heat dissipation effect.

2. Description of Related Art

In general, an electronic device generates a high temperature during operation. To avoid overheating of the electronic device, a radiator is usually arranged at a heat source, so that the heat is carried to the radiator so as to cool the heat source. However, how to obtain a more efficient heat dissipation capability is a research objective in this field.

The information disclosed in this Description of Related Art section is only for enhancement of understanding of the background of the described technology and therefore it may contain information that does not form the prior art that is already known to a person of ordinary skill in the art. Further, the information disclosed in the Description of Related Art section does not mean that one or more problems to be resolved by one or more embodiments of the disclosure were acknowledged by a person of ordinary skill in the art.

SUMMARY OF THE INVENTION

The disclosure provides a heat dissipation device, which can provide a better heat dissipation effect.

The disclosure also provides a projector, which is provided with the heat dissipation device.

The heat dissipation device provided by the disclosure includes a first fin structure and a heat conduction member. The first fin structure includes a first substrate and a plurality of first fins extending from the first substrate, the first fins include a plurality of first ends and a plurality of second ends, which are opposite to each other, the first ends are connected to the first substrate, the second ends are away from the first substrate, and the second ends contact the heat conduction member.

The projector provided by the disclosure includes at least one light source, a heat dissipation device, an optical element, a light valve device and a projection lens. The at least one light source is adapted to emit at least one first light beam. The heat dissipation device includes a first fin structure which includes a first substrate and a plurality of first fins, the at least one light source is thermally coupled to the first substrate, the first fins extend from the first substrate, the first fins include a plurality of first ends and a plurality of second ends opposite to the plurality of first ends, the first ends are connected to the first substrate, and the second ends are away from the first substrate. The second ends contact the heat conduction member, where the heat generated by the at least one light source is suitable for being conducted to the heat conduction member through the first substrate and the first fins. The optical element is arranged on a transmission path of the at least one first light beam, and the at least one first light beam is integrated into a second light beam after passing through the optical element. The light valve device is arranged on a transmission path of the second light beam, and the second light beam is converted into an image beam after passing through the light valve device. The projection lens is arranged on a transmission path of the image beam and is adapted to enlarge the image beam into a projecting beam.

Based on the above, in the heat dissipation device provided by the disclosure, the first fins contact the heat conduction member at the second ends away from the first substrate, thereby increasing the overall heat dissipation area to improve the heat dissipation effect.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
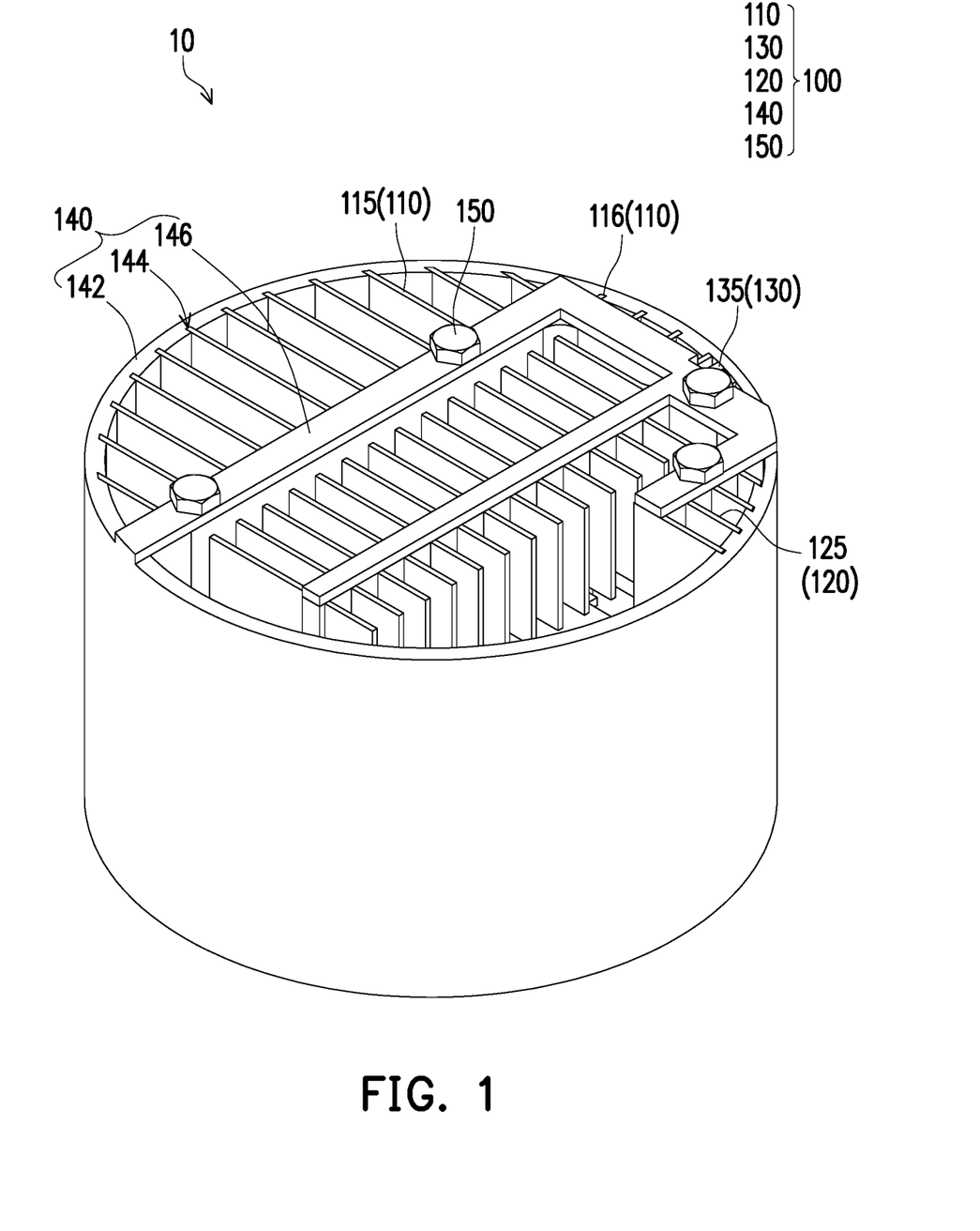
FIG. 1 is a schematic view of a portion of a projector according to an embodiment of the disclosure.
Figure 2:
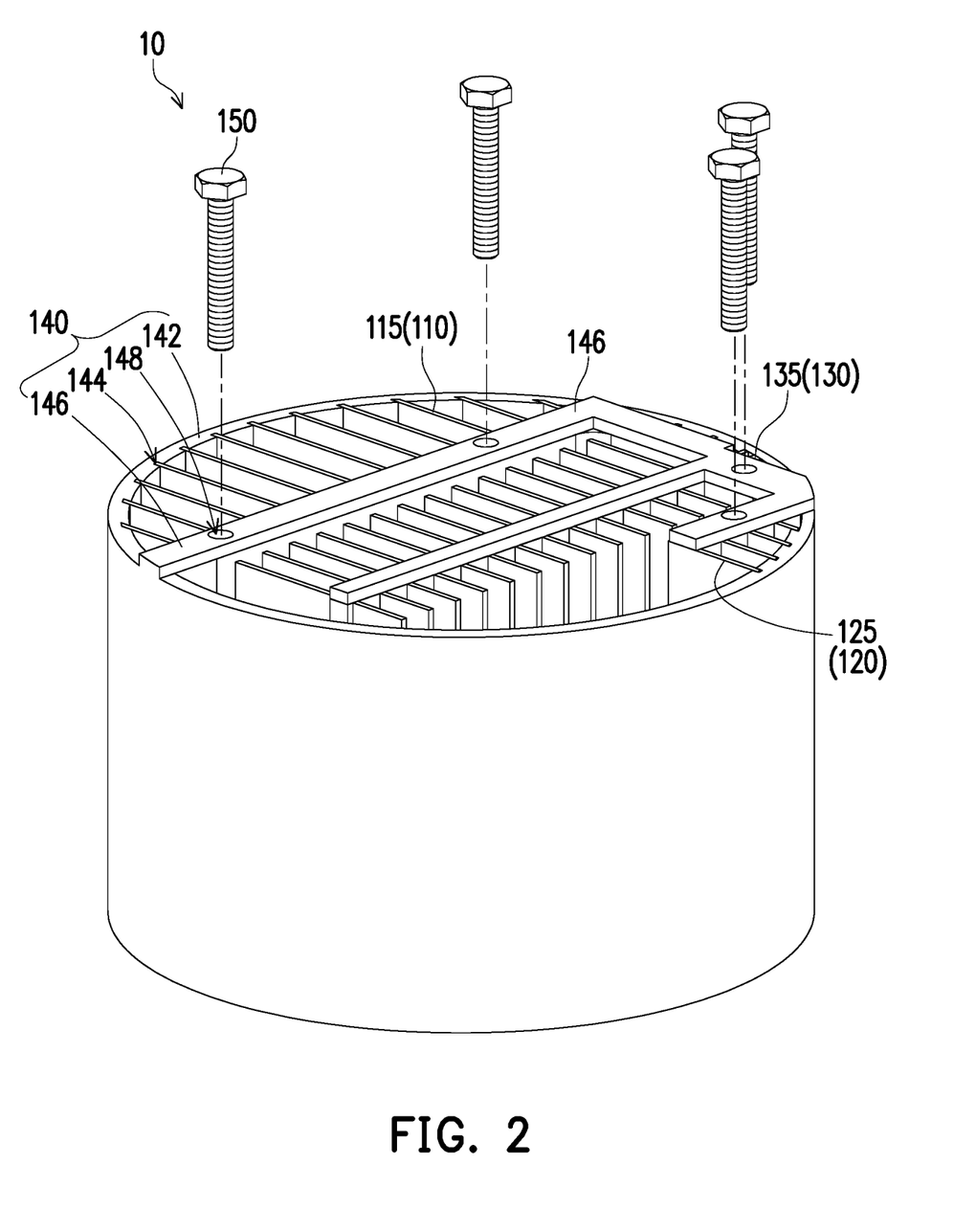
FIG. 2 to FIG. 4 are schematic views of a disassembly process of a portion of the projector in FIG. 1.
Figure 3:
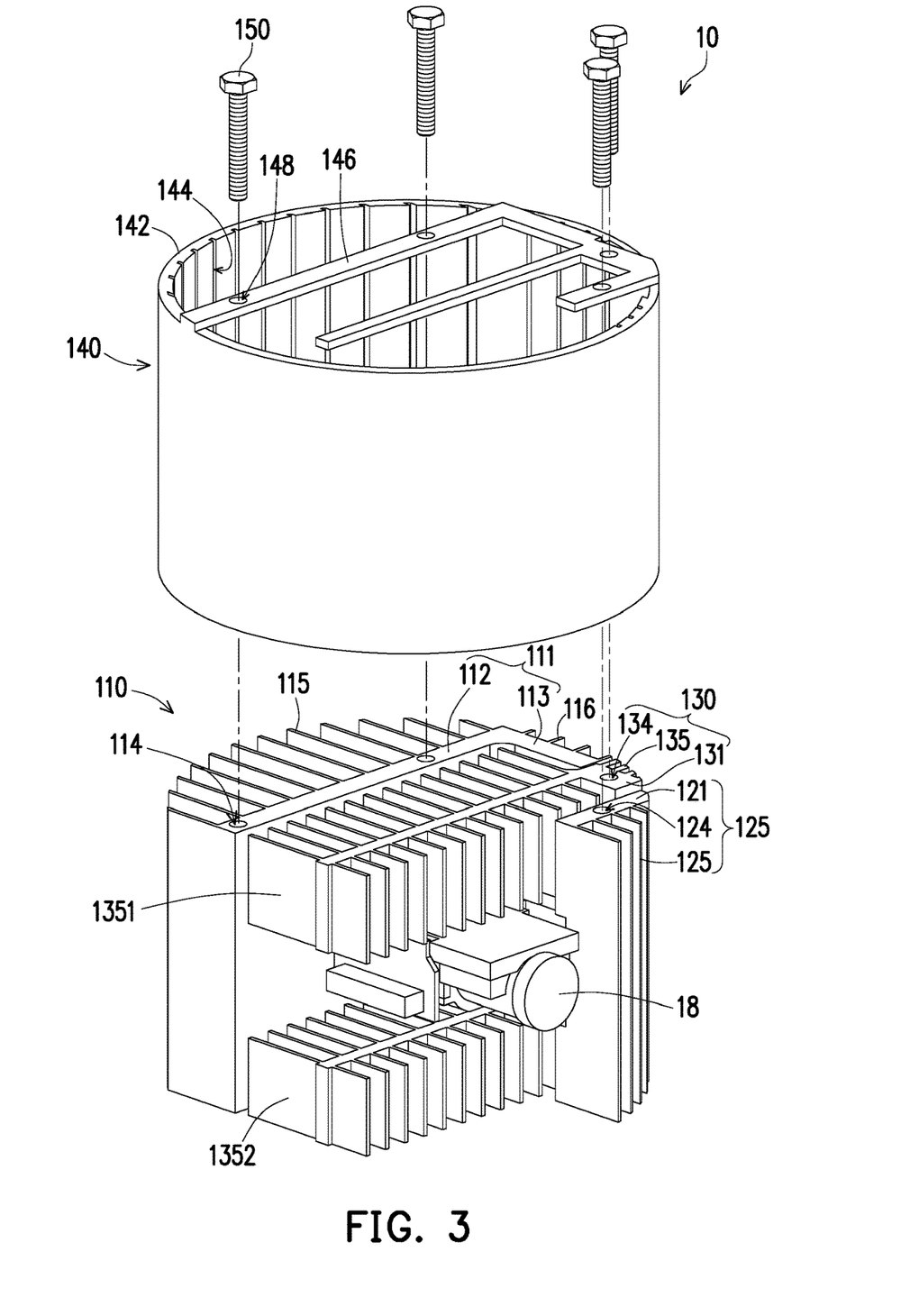
Figure 4:
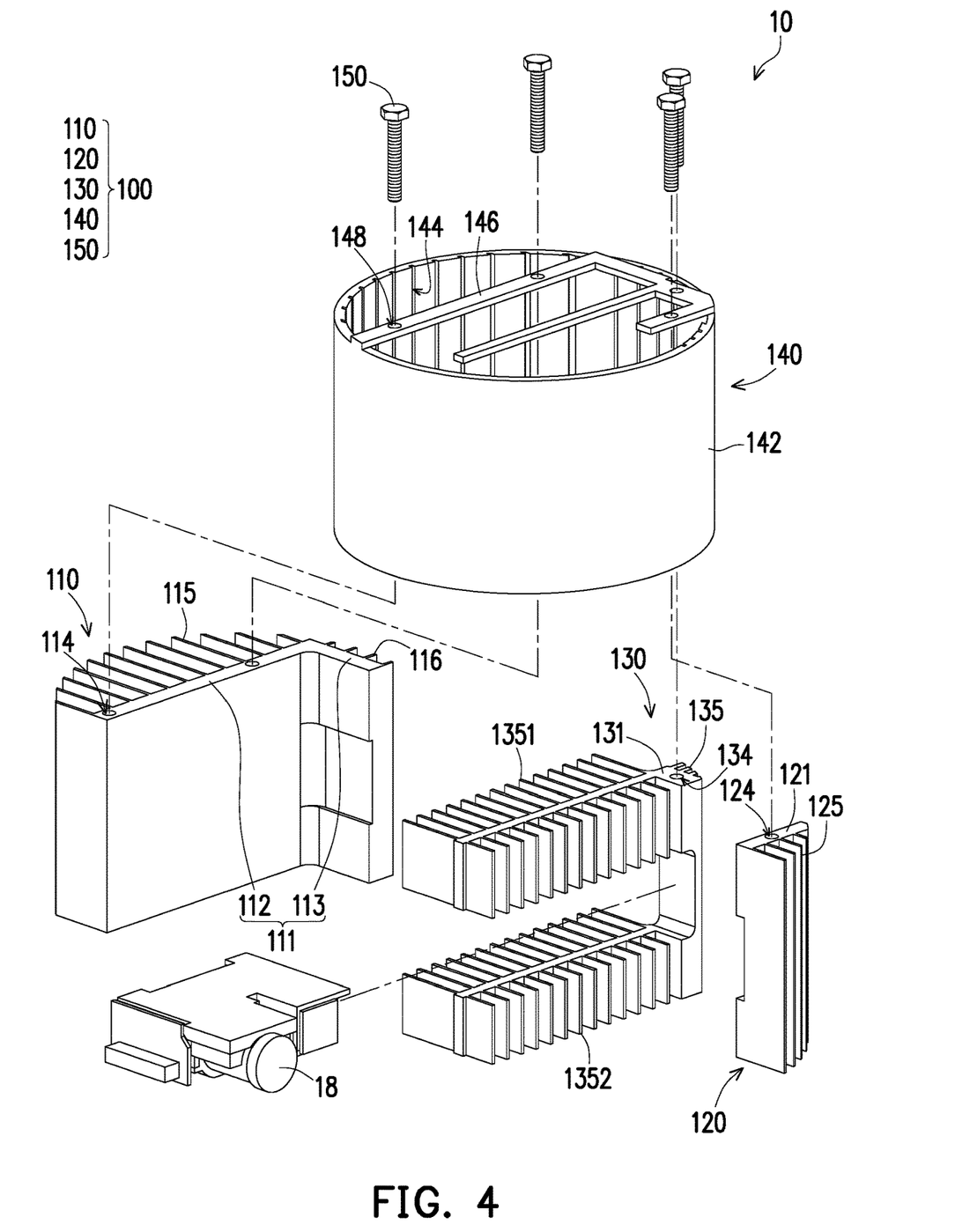
Figure 5A:
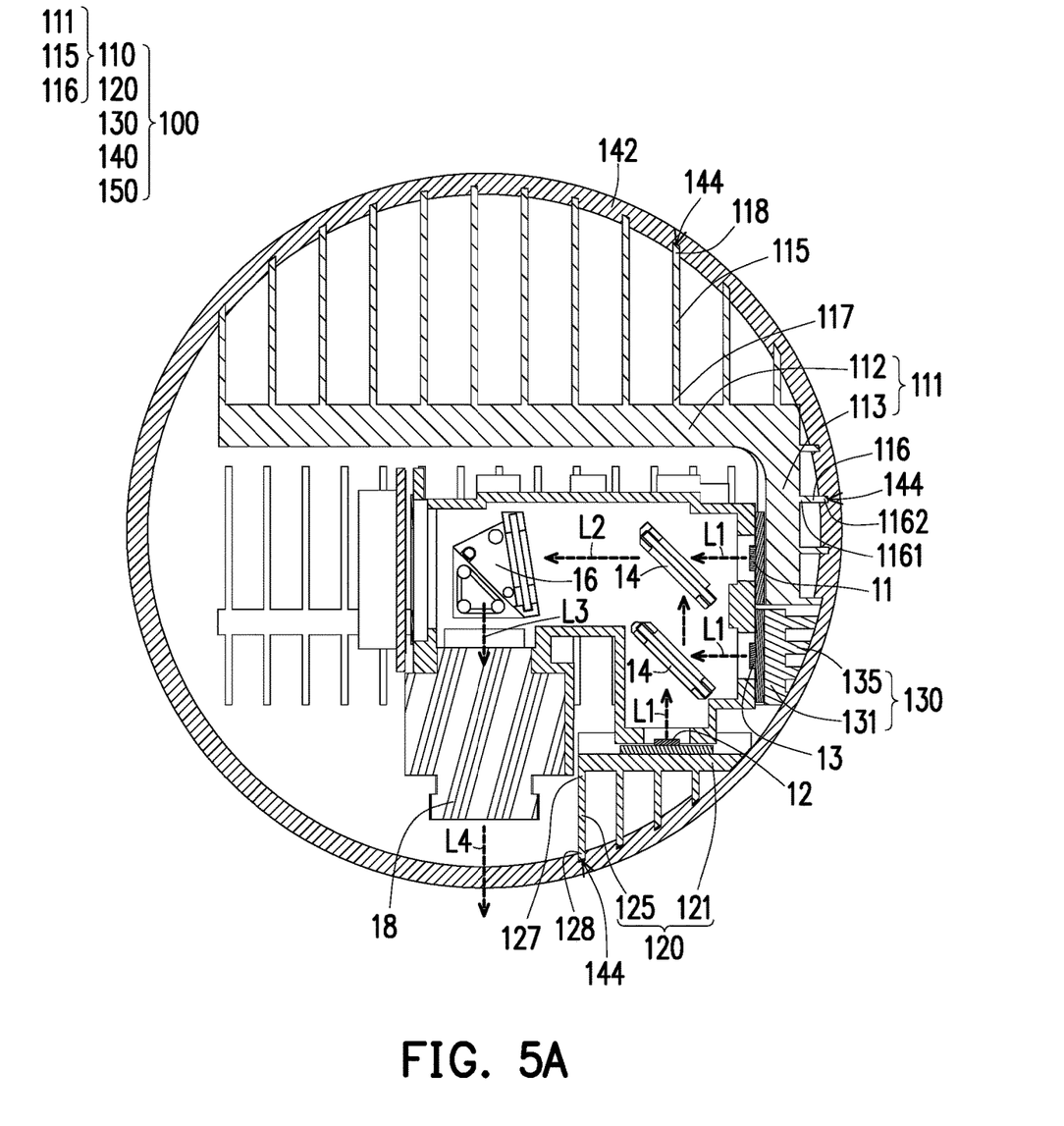
FIG. 5A is a cross-sectional top view of a portion of the projector in FIG. 1.

FIG. 1 is a schematic view of a portion of a projector according to an embodiment of the disclosure. FIG. 2 to FIG. 4 are schematic views of a disassembly process of a portion of the projector in FIG. 1. FIG. 5A is a cross-sectional top view of a portion of the projector in FIG. 1.

FIG. 1 to FIG. 4 show the process of gradually disassembling a projector 10, and FIG. 5A shows the internal structure of the projector 10. As shown in FIG. 5A, the projector 10 of the embodiment includes light sources 11, 12 and 13, a heat dissipation device 100, an optical element 14, a light valve device 16 and a projection lens 18. In the embodiment, the light sources 11, 12 and 13 respectively represent a green light source, a blue light source and a red light source. Each of the light sources 11, 12 and 13 can be a light emitting diode (LED) or a laser light source such as a laser diode, but the variety and quantity of the light sources 11, 12 and 13 are not limited. In the embodiment, the light sources 11, 12 and 13 are adapted to emit first light beams L1, and the first light beams L1 can represent green light, blue light or red light. The light sources 11, 12 and 13 emit green light, blue light or red light according to a time sequence.

The optical element 14 is arranged on a transmission path of the first light beams L1, and the first light beams L1 are integrated into a second light beam L2 after passing through the optical element 14. In the embodiment, the optical element 14 can be a reflecting mirror, and the reflecting mirror is adapted to change the transmission path of light beams; or the optical element 14 can be a beam splitter, and the beam splitter can be a transflective element, a see through mirror, a dichroic mirror, a polarizing beam splitter or other various elements capable of splitting light beams. For example, in the embodiment, the optical element 14 can allow light beams of one or more colors to penetrate through while providing a reflection effect on light beams of other colors. Certainly, the form of the optical element 14 is not limited thereto. In an embodiment, the projector 10 can also include a light homogenizing element which is arranged on the transmission path of the second light beam L2. In the embodiment, the light homogenizing element includes an integrated rod or a lens array, can homogenize the passing light beams, and can be matched with other lenses so as to guide the second light beam L2. However, the disclosure is not limited thereto.

Subsequently, the light valve device 16 is arranged on the transmission path of the second light beam L2, and the second light beam L2 passing through the optical element 14 is converted into an image beam L3 after passing through the light valve device 16. In the embodiment, the light valve device 16 can be, for example, a digital micro-mirror device (DMD) or a liquid-crystal-on-silicon panel (LCOS panel). However, in other embodiments, the light valve device 16 can also be a penetrable liquid crystal panel or other beam modulators. Finally, the projection lens 18 is arranged on the transmission path of the image beam L3 and is adapted to enlarge the image beam L3 into a projecting beam L4 so as to form an image.

Because the light sources 11, 12 and 13 generate high temperatures during operation of the projector 10, in the embodiment, the heat dissipation device 100 can effectively perform heat dissipation on the light sources 11, 12 and 13, and the specific contents are described below. Furthermore, it should be noted that in the embodiment, the heat dissipation device 100 is applied to the projector 10. In other embodiments, the heat dissipation device 100 can also be applied to other electronic devices, such as a mother board. However, the disclosure is not limited thereto.

In the embodiment, the heat dissipation device 100 includes a first fin structure 110, a second fin structure 120 and a third fin structure 130 which are thermally coupled to the three light sources 11, 12 and 13 respectively so as to perform heat dissipation on the light sources 11, 12 and 13. For example, the first fin structure 110, the second fin structure 120 and the third fin structure 130 perform heat dissipation on the light sources 11, 12 and 13 in a mode of heat conduction. Certainly, in other embodiments, one or more fin structures can be arranged, and the quantity of the fin structures can be corresponding to the quantity of the light sources 11, 12 and 13 or can also be not corresponding to the quantity of the light sources 11, 12 and 13 and is not limited thereto.

In detail, in the embodiment, the first fin structure 110 includes a first substrate 111 and a plurality of first fins 115 and 116, the light source 11 is thermally coupled to the first substrate 111, and the first fins 115 and 116 extend from the first substrate 111. In the embodiment, the fins are arranged in the limited space as much as possible so as to provide a larger heat dissipation area. The first substrate 111 includes a first plate 112 and a second plate 113 connected with the first plate 112 in a bending manner. The first fins 115 are formed on the first plate 112, and the first fins 116 are formed on the second plate 113. The extension direction of the first fins 115 formed on the first plate 112 is different from the extension direction of the first fins 116 formed on the second plate 113. In the embodiment, the extension direction of the first fins 115 is perpendicular to the extension direction of the first fins 116. Certainly, in other embodiments, the forms of the first substrate 111 and the first fins 115 and 116 are not limited thereto.

The first fins 115 include a plurality of first ends 117 and a plurality of second ends 118, which are opposite to each other. The first fins 116 include a plurality of first ends 1161 and a plurality of second ends 1162, which are opposite to each other. The first ends 117 and 1161 are respectively connected to the first plate 112 and the second plate 113 of the first substrate 111. The second ends 118 and 1162 are away from the first substrate 111 and the second plate 113. The second ends 118 and 1162 contact the heat conduction member 140. In other words, the heat generated by emitting light by the light source 11 is transmitted to the heat conduction member 140 through the first substrate 111 and the first fins 115 and 116. Compared with a general structure capable of realizing heat dissipation through fins only, the heat dissipation device 100 of the embodiment can provide a larger heat dissipation area through the heat conduction member 140 connected with the second ends 118 and 1162 of the first fins 115 and 116, thereby accelerating heat dissipation of the light source 11. The contact can be regarded as connection, touch or clamping, and contact is realized as long as partial contact occurs.

In the embodiment, as shown in FIG. 4 and FIG. 5A, the heat conduction member 140 includes a cylinder 142, the cylinder 142 of the heat conduction member 140 is sleeved the first fin structure 110 outside, and the second ends 118 and 1162 contact the inside of the cylinder 142. More specifically, the cylinder 142 has a plurality of grooves 144 recessed in the inner surface. As shown in FIG. 5A, the second ends 118 and 1162 of the first fins 115 and 116 are inserted into the grooves 144 and are in close contact with the cylinder 142. In the embodiment, the inner contours of the grooves 144 conform(fit) to the outer contours of the second ends 118 and 1162 of the first fins 115 and 116.

Furthermore, in the embodiment, the size of the grooves 144 is slightly greater than the size of the second ends 118 and 1162 of the first fins 115 and 116, thereby facilitating assembly. After the second ends 118 and 1162 of the first fins 115 and 116 are inserted into the grooves 144, an assembler can slightly rotate or move the first fins 115 and 116 to enable one side of each of the first fins 115 and 116 to be attached to the wall surfaces of the grooves 144, so that good thermal contact is formed between the first fins 115 and 116 and the heat conduction member 140.

In the embodiment, the thermal conduction coefficients of the first fins 115 and 116 and the heat conduction member 140 are, for example, greater than 5 (W/mk), and the materials of the first fins 115 and 116 and the heat conduction member 140 are metals, plastics doped with graphite, or the like. However, in other embodiments, the thermal conduction coefficients and materials of the first fins 115 and 116 and the heat conduction member 140 are not limited thereto. Furthermore, in the embodiment, the second ends 118 and 1162 of the first fins 115 and 116 are in a polygonal shape, such as a square shape or a trapezoidal shape, the grooves 144 correspondingly have the same shape, but the shapes of the second ends 118 and 1162 and the grooves 144 are not limited thereto. In other embodiments, the second ends 118 and 1162 can also be a sharp corner similar to a triangular shape and can also be in other shapes.

It is worth mentioning that in the embodiment, the second fin structure 120 for being thermally coupled to the light source 12 is similar to the first fin structure 110. In detail, the second fin structure 120 includes a second substrate 121 and a plurality of second fins 125 extending from the second substrate 121. The second fins 125 include a plurality of third ends 127 and a plurality of fourth ends 128, which are opposite to each other. The third ends 127 are connected to the second substrate 121. The fourth ends 128 are away from the second substrate 121 and contact the heat conduction member 140. Similarly, in the embodiment, the fourth ends 128 extend into the grooves 144 of the cylinder 142 of the heat conduction member 140 so as to be in good contact with the cylinder 142.

In addition, in the embodiment, the third fin structure 130 for being thermally coupled to the light source 13 includes a third substrate 131 and a plurality of third fins 135, 1351 (FIG. 4) and 1352 (FIG. 4) extending from the third substrate 131. In the embodiment, the third fins 135 are in contact with the inner surface of the cylinder 142 so as to achieve a thermal coupling effect. Furthermore, as shown in FIG. 4, the third fins 1351 and 1352 extend to the upper and lower sides of the light source 13, the optical element 14, the light valve device 16 and the lens 18 and are not in contact with the cylinder 142. In other words, the fins of the heat dissipation device 100 can be in contact with the heat conduction member 140 in different forms; and furthermore, portions of the fins can be in contact with to the heat conduction member 140, and the other portions of the fins are not in contact with to the heat conduction member 140.

It is worth mentioning that in the embodiment, the cylinder 142 of the heat conduction member 140 provides a containing space for containing the first fin structure 110, the second fin structure 120 and the third fin structure 130, and the light sources 11, 12 and 13, the optical element 14, the light valve device 16 and the projection lens 18 can also be contained in the cylinder 142 of the heat conduction member 140. Because each element of the projector 10 is arranged in the cylinder 142 of the heat conduction member 140, the overall volume is smaller. Certainly, in other embodiments, the shape of the heat conduction member 140 is not limited thereto, and the elements of the projector 10 do not need to be completely arranged in the heat conduction member 140.

In addition, as shown in FIG. 4, in the embodiment, the heat dissipation device 100 also includes locking members 150. The heat conduction member 140 includes a bracket 146 fixed on the cylinder 142. The bracket 146 includes through holes 148. The first substrate 111 of the first fin structure 110 includes screw holes 114. The second substrate 121 of the second fin structure 120 includes a screw hole 124. The third substrate 131 of the third fin structure 130 includes a screw hole 134. The plurality of locking members 150 respectively penetrate through the plurality of through holes 148 in the bracket 146 and are fixed to the screw holes 114, 124 and 134 in the first substrate 111, the second substrate 121 and the third substrate 131 so as to fix the first fin structure 110, the second fin structure 120 and the third fin structure 130 to the heat conduction member 140. The heat dissipation device 100 is very simple and convenient to assemble. Certainly, in other embodiments, the first fin structure 110, the second fin structure 120 and the third fin structure 130 can also be fixed to the heat conduction member 140 in modes of clamping, close fitting and the like instead of locking only.

Figure 5B:
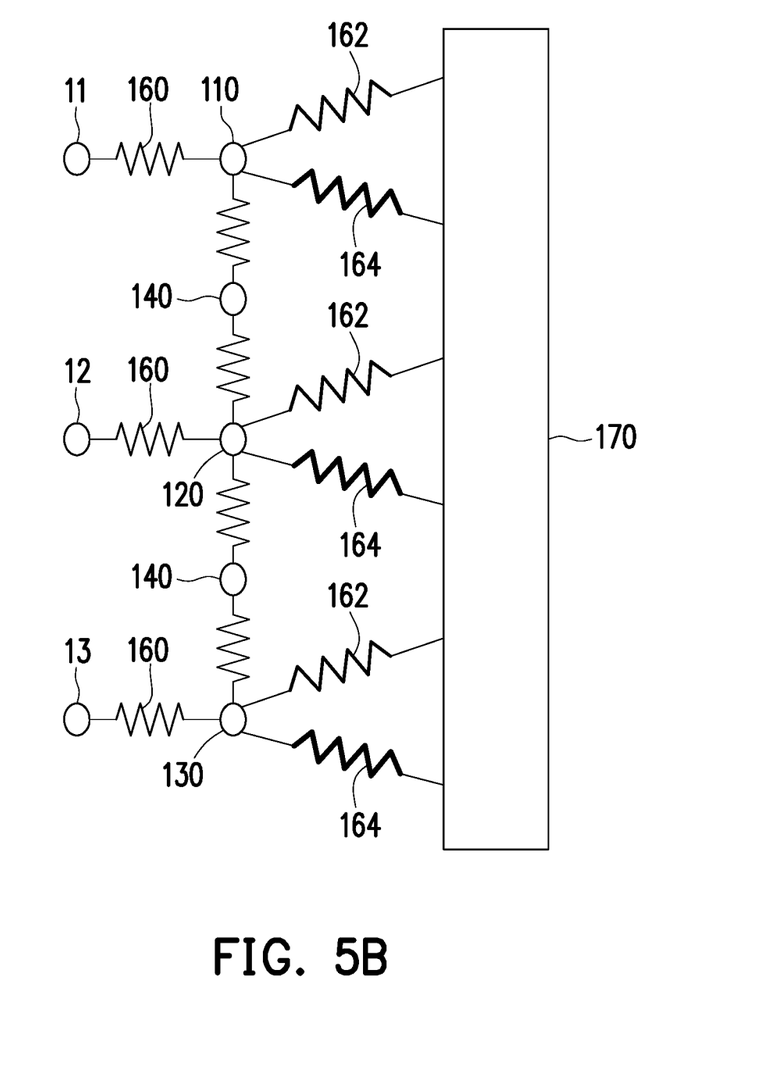
FIG. 5B is a schematic view of a heat dissipation path of a portion of the projector in FIG. 1.

FIG. 5B is a schematic view of a heat dissipation path of the projector in FIG. 1.

Referring to FIG. 5A and FIG. 5B, in the embodiment, heat is conducted between the three light sources 11, 12 and 13 and the first fin structure 110, the second fin structure 120 and the third fin structure 130 in a mode of heat conduction. Taking a thermal resistor 160 as an example, the three light sources 11, 12 and 13 directly transmit the heat to the heat conduction member 140 in a mode of heat conduction respectively through the first fin structure 110, the second fin structure 120 and the third fin structure 130.

Compared with the traditional heat dissipation structure in which each light source is only thermally coupled to an individual fin structure, in the embodiment, if one of the light sources 11, 12 and 13 generates more heat, the heat is guided to the outside of the heat conduction member 140, and the heat can also be conducted to the fin structures connected with other light sources through the heat conduction member 140, so that other fin structures can assist in heat dissipation of the light source. Or, if the volume of the fin structure connected with one of the light sources 11, 12 and 13 is smaller, because the fin structure with the smaller volume is connected to the heat conduction member 140 and is thermally coupled to other fin structures through the heat conduction member 140, the heat conduction member 140 and other fin structures can be adapted to assist in heat dissipation of the light source.

In addition, the first fin structure 110, the second fin structure 120, the third fin structure 130 and the heat conduction member 140 can also transmit heat to air 170 in modes of thermal convection and thermal radiation, where a thermal resistor 162 serves as a representative of thermal convection, and a thermal resistor 164 serves as a representative of thermal radiation.

By virtue of actual measurement, compared with the known heat dissipation structure in which each light source is only thermally coupled to an individual fin structure, the heat dissipation device 100 of the embodiment can reduce the temperature of the light sources 11, 12 and 13 by 7% to 27% and has a good heat dissipation effect by arranging the heat conduction member 140 in contact with the tail ends of the fins.

Other types of projectors are introduced below, the same or similar elements as those in the previous embodiment are shown by the same or similar symbols and are not described in detail, and only the main difference is explained.

Figure 6:
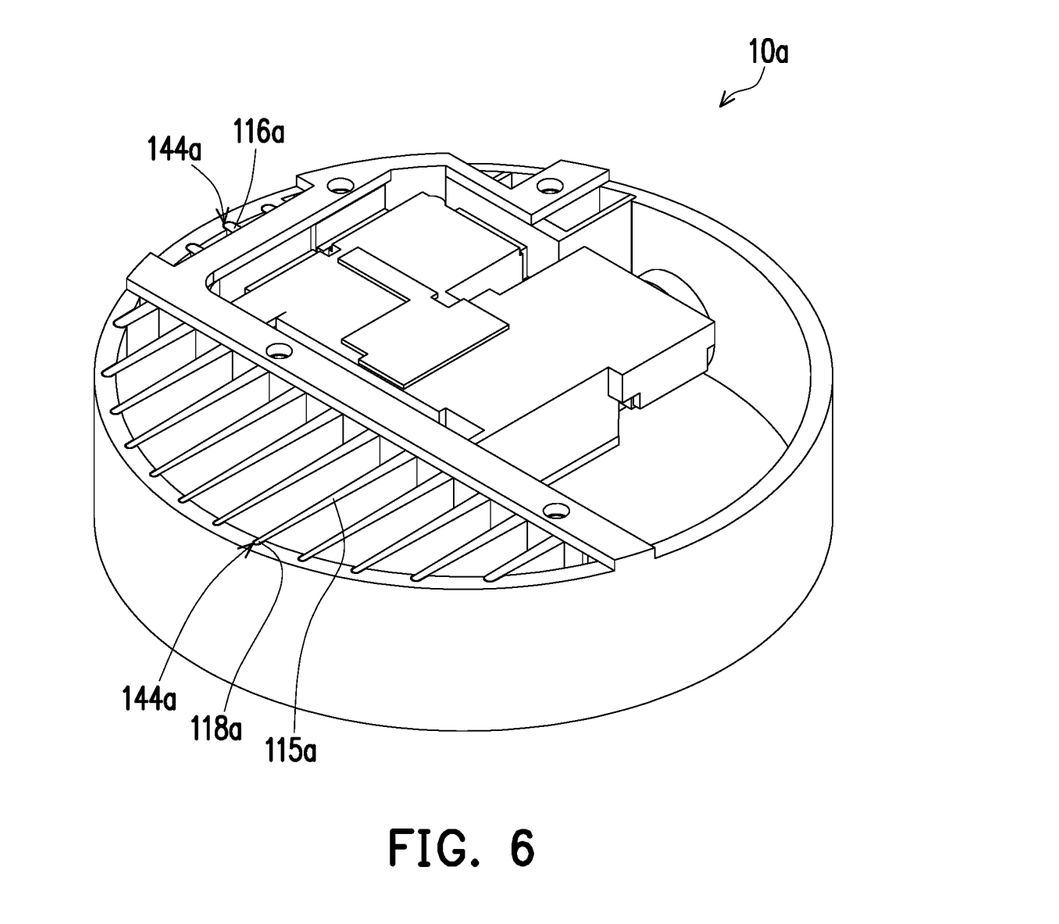
FIG. 6 is a schematic view of a portion of a projector according to another embodiment of the disclosure.
Figure 7:
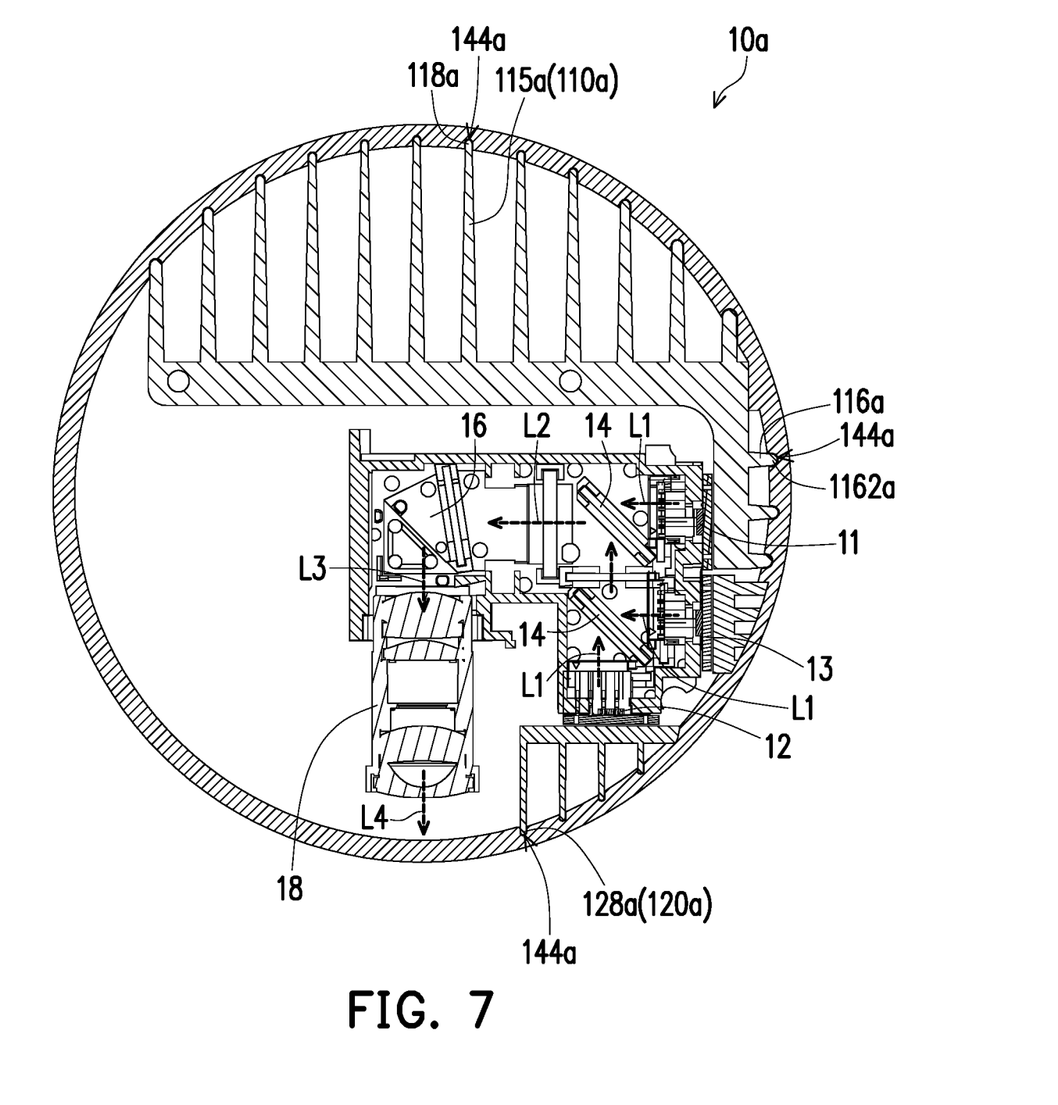
FIG. 7 is a cross-sectional top view of a portion of the projector in FIG. 6.

FIG. 6 is a schematic view of a portion of a projector according to another embodiment of the disclosure. FIG. 7 is a cross-sectional view of a portion of the projector in FIG. 6. Referring to FIG. 6 and FIG. 7, the main difference between a projector 10a of the embodiment and the projector 10 in FIG. 5A is as follows: in the embodiment, the second ends 118a and 1162a of first fins 115a and 116a of a first fin structure 110a are in an arc shape, the fourth ends 128a of a second fin structure 120a are in an arc shape, and grooves 144a are correspondingly in an arc shape.

Figure 8:
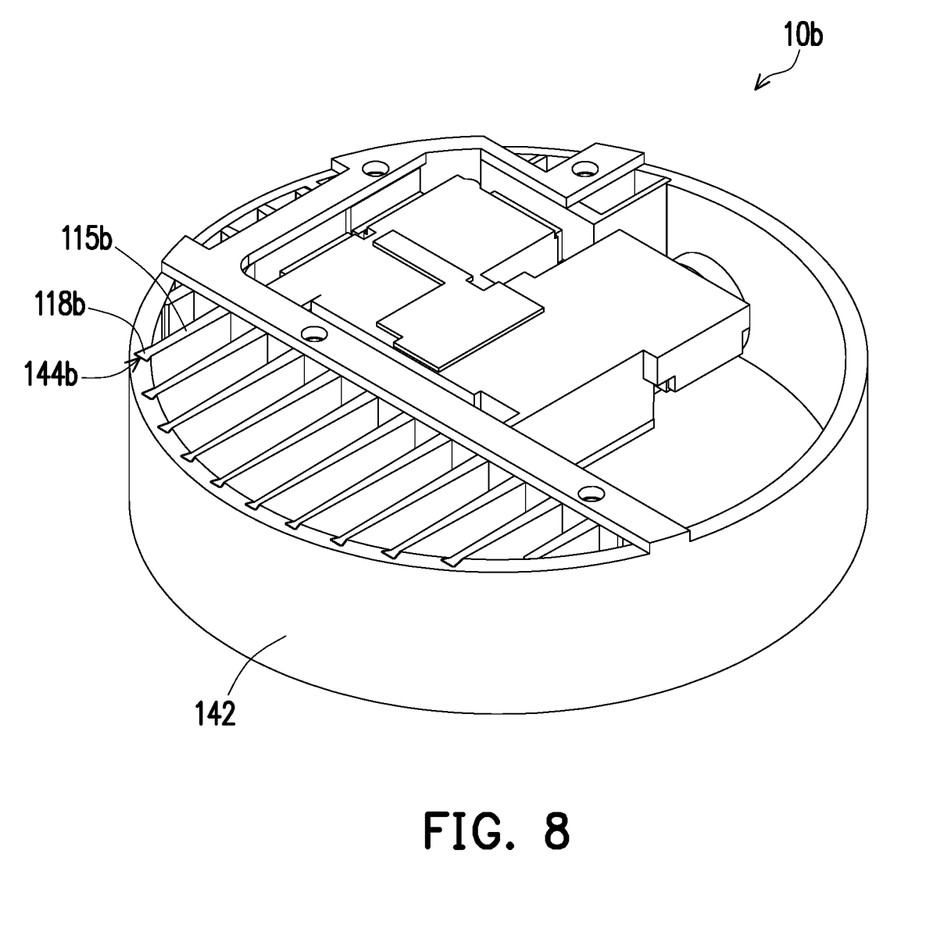
FIG. 8 is a schematic view of a portion of a projector according to another embodiment of the disclosure.
Figure 9:
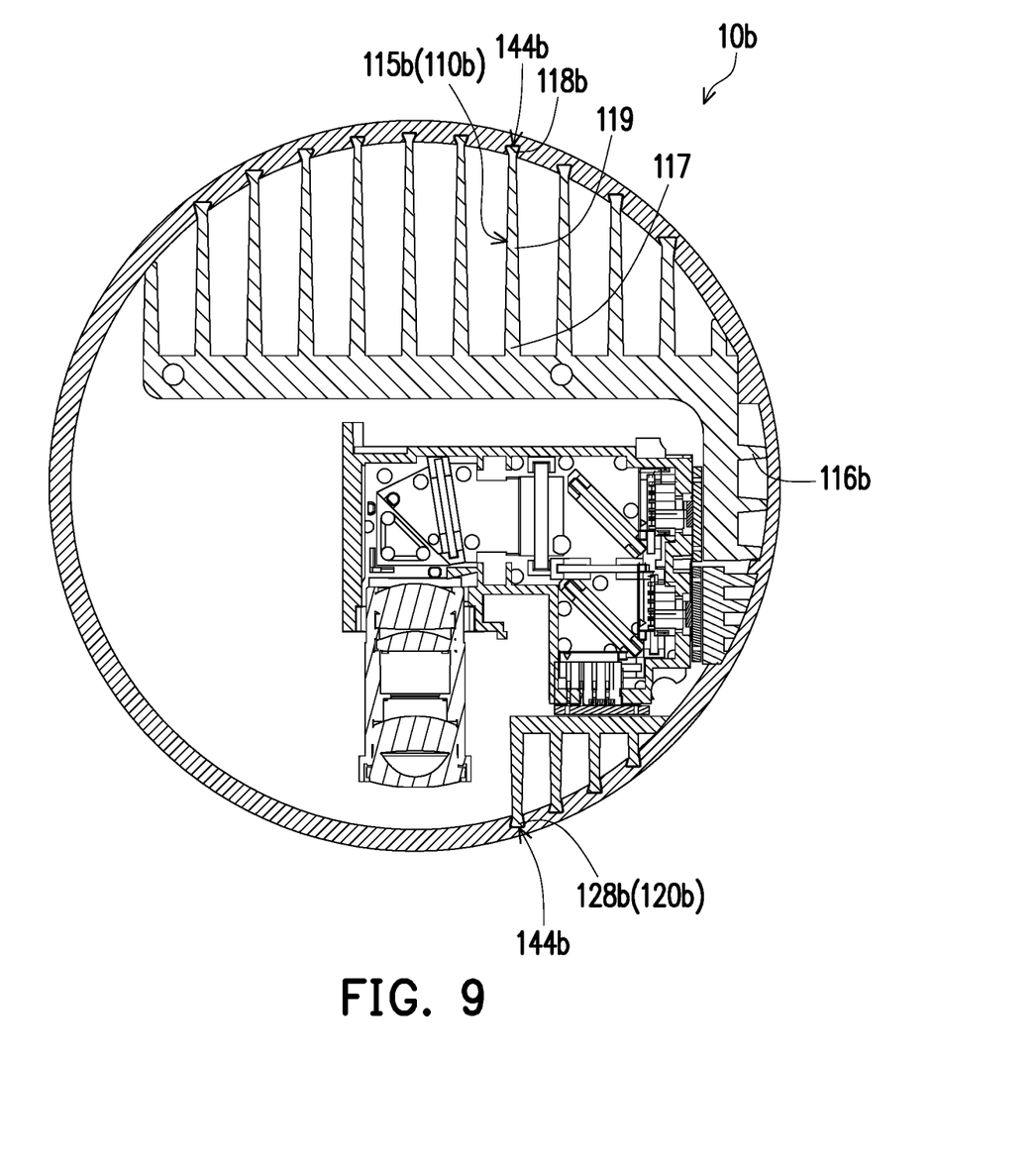
FIG. 9 is a cross-sectional top view of a portion of the projector in FIG. 8.

FIG. 8 is a schematic view of a portion of a projector according to another embodiment of the disclosure. FIG. 9 is a cross-sectional view of a portion of the projector in FIG. 8. Referring to FIG. 8 and FIG. 9, the main difference between a projector 10b of the embodiment and the projector 10 in FIG. 5A is as follows: in the embodiment, the first fins 115b of a first fin structure 110b include a plurality of middle sections 119 connected to the first ends 117 and second ends 118b. The thicknesses of the second ends 118b of the first fins 115b of the first fin structure 110b are gradually enlarged along a direction away from the first ends 117 and the middle sections 119, and the second ends 118b are in a shape similar to a dovetail or in an inverted trapezoidal shape. The second ends 118b of the first fins 115b of the first fin structure 110b are in a dovetail shape or an inverted trapezoidal shape. Similarly, the thicknesses of the fourth ends 128b of the second fin structure 120b are also gradually enlarged, and the fourth ends 128b are in a shape similar to a dovetail or in an inverted trapezoidal shape. The fourth ends 128b of the second fin structure 120b are in a dovetail shape or an inverted trapezoidal shape. The grooves 144b are correspondingly in a dovetail shape or an inverted trapezoidal shape, so that the bottom width of each groove 144b is greater than the opening width. Furthermore, in the embodiment, the first fins 116b of the first fin structure 110b are in direct contact with the inner surface of the cylinder 142. In other words, the first fins 115b and 116b of the first fin structure 110b can also have multiple forms.

Figure 10:
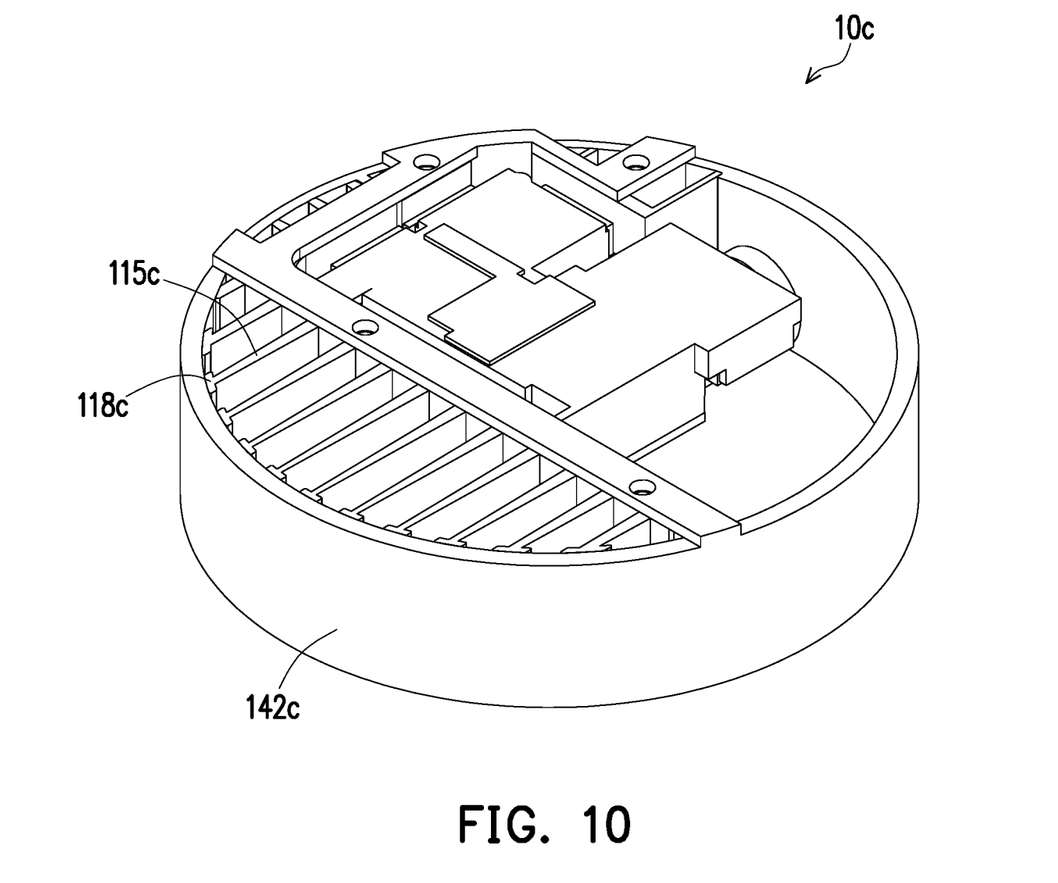
FIG. 10 is a schematic view of a portion of a projector according to another embodiment of the disclosure.
Figure 11:
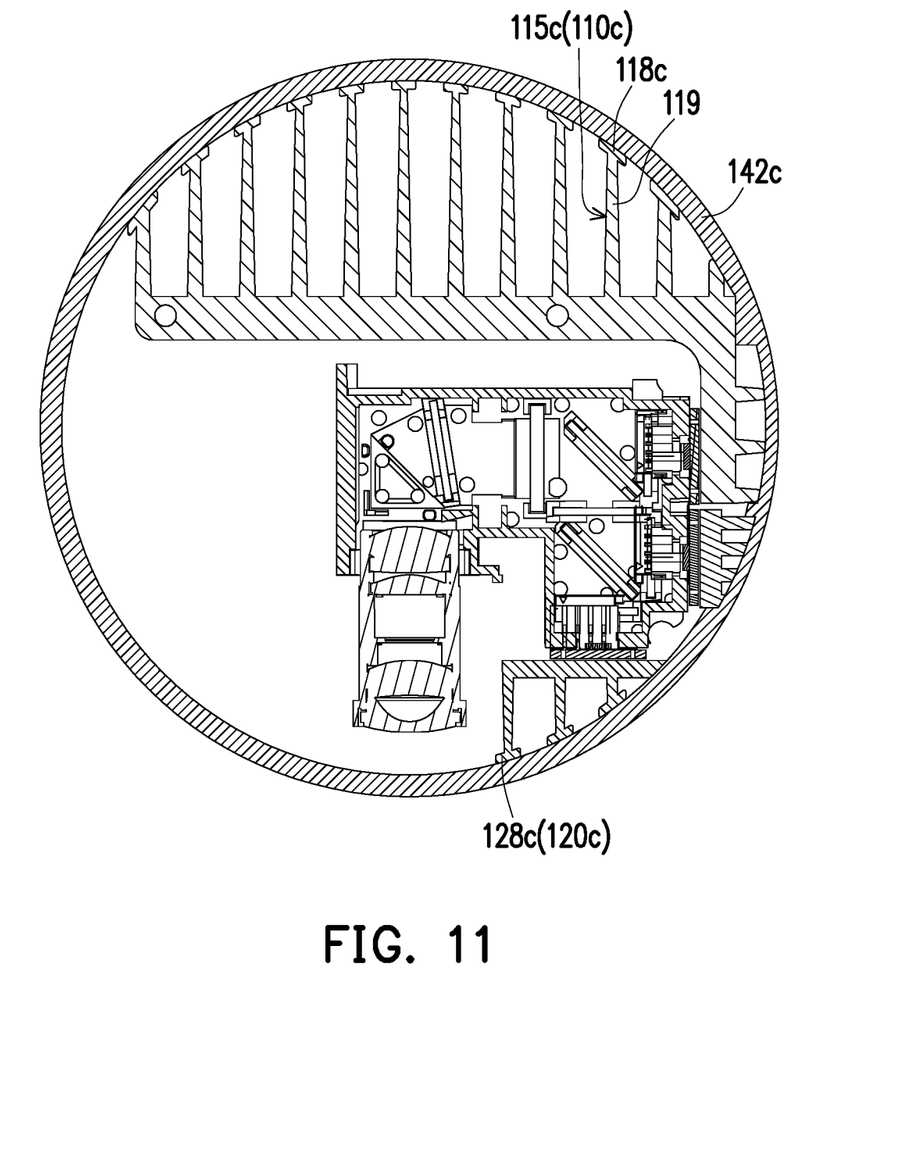
FIG. 11 is a cross-sectional top view of a portion of the projector in FIG. 10.

FIG. 10 is a schematic view of a portion of a projector according to another embodiment of the disclosure. FIG. 11 is a cross-sectional view of a portion of the projector in FIG. 10. Referring to FIG. 10 and FIG. 11, the main difference between a projector 10c of the embodiment and the projector 10 in FIG. 5A is as follows: in the embodiment, no groove is formed inside a cylinder 142c. As shown in FIG. 11, the second ends 118c of first fins 115c of a first fin structure 110c are increased in size relative to the middle sections 119, so that the thicknesses of the second ends 118c a greater than the thicknesses of parts of the middle sections 119 connected to the second ends 118c. Similarly, the thicknesses of the fourth ends 128c of the second fin structure 120c are also increased, so that the first fin structure 110c and the second fin structure 120c can be in contact with the surface of the heat conduction member 140 in a larger area through the second ends 118c and the fourth ends 128c so as to improve the heat conduction effect.

In conclusion, in the heat dissipation device provided by the disclosure, the first fins contact the heat conduction member at the second ends away from the first substrate, thereby increasing the overall heat dissipation area to improve the heat dissipation effect. Furthermore, in an embodiment, the heat dissipation device can be applied to a plurality of heat sources (such as light sources), and a plurality of fin structures corresponding to the heat sources can be arranged in the heat conduction member and are thermally coupled (thermally conducted) to each other, thereby providing a good heat dissipation effect.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the disclosure as defined by the following claims. Moreover, no element and component in the disclosure is intended to be dedicated to the public regardless of whether the element or component is explicitly recited in the following claims.

What is claimed is:

1. A projector, comprising at least one light source, a heat dissipation device, an optical element, a light valve device and a projection lens, wherein the at least one light source is adapted to emit at least one first light beam;

the heat dissipation device comprises a first fin structure and a heat conduction member, wherein the first fin structure comprises a first substrate and a plurality of first fins, the at least one light source is thermally coupled to the first substrate, the plurality of first fins extends from the first substrate, the plurality of first fins comprises a plurality of first ends and a plurality of second ends opposite to the plurality of first ends, the plurality of first ends is connected to the first substrate, and the plurality of second ends is away from the first substrate; and the plurality of second ends contacts the heat conduction member, wherein heat generated by the at least one light source is conducted to the heat conduction member through the first substrate and the plurality of first fins;

the optical element is arranged on a transmission path of the at least one first light beam, and the at least one first light beam is integrated into a second light beam after passing through the optical element;

the light valve device is arranged on a transmission path of the second light beam, and the second light beam is converted into an image beam after passing through the light valve device; and the projection lens is arranged on a transmission path of the image beam and is adapted to enlarge the image beam into a projecting beam, and wherein the heat conduction member comprises a cylinder, the cylinder is sleeved the first fin structure outside, a plurality of grooves is recessed in an inside surface of the cylinder, the plurality of second ends of the plurality of first fins is inserted into the plurality of grooves of the cylinder.

2. The projector of claim 1, wherein inner contours of the plurality of grooves conform to outer contours of the plurality of second ends of the plurality of first fins.

3. The projector of claim 2, wherein the plurality of second ends is arc-shaped or polygonal.

4. The projector of claim 2, wherein thicknesses of the plurality of second ends are gradually enlarged along a direction away from the plurality of first ends.

5. The projector of claim 2, wherein a bottom width of at least one of the plurality of grooves is greater than an opening width of the at least one of the plurality of grooves.

6. The projector of claim 1, wherein the plurality of first fins comprises a plurality of middle sections connected to the plurality of first ends and the plurality of second ends, thicknesses of the plurality of second ends are greater than thicknesses of parts of the plurality of middle sections connected to the plurality of second ends, and the plurality of second ends is in contact with a surface of the heat conduction member.

7. The projector of claim 1, wherein the at least one light source, the optical element, the light valve device and the projection lens are located in the heat conduction member.

8. The projector of claim 1, wherein the heat dissipation device further comprises a second fin structure, the second fin structure comprises a second substrate and a plurality of second fins extending from the second substrate, the plurality of second fins comprises a plurality of third ends and a plurality of fourth ends, which are opposite to each other, the plurality of third ends is connected to the second substrate, and the plurality of fourth ends is away from the second substrate and contacts the heat conduction member.

9. A projector, comprising at least one light source, a heat dissipation device, an optical element, a light valve device and a projection lens, wherein the at least one light source is adapted to emit at least one first light beam;

the heat dissipation device comprises a first fin structure and a heat conduction member, wherein the first fin structure comprises a first substrate and a plurality of first fins, the at least one light source is thermally coupled to the first substrate, the plurality of first fins extends from the first substrate, the plurality of first fins comprises a plurality of first ends and a plurality of second ends opposite to the plurality of first ends, the plurality of first ends is connected to the first substrate, and the plurality of second ends is away from the first substrate; and the plurality of second ends contacts the heat conduction member, wherein heat generated by the at least one light source is conducted to the heat conduction member through the first substrate and the plurality of first fins;

the optical element is arranged on a transmission path of the at least one first light beam, and the at least one first light beam is integrated into a second light beam after passing through the optical element;

the light valve device is arranged on a transmission path of the second light beam, and the second light beam is converted into an image beam after passing through the light valve device; and the projection lens is arranged on a transmission path of the image beam and is adapted to enlarge the image beam into a projecting beam, wherein the heat conduction member comprises a cylinder, the cylinder is sleeved the first fin structure outside, the plurality of second ends contacts an inside of the cylinder, the first substrate comprises a first plate and a second plate connected with the first plate in a bending manner, the plurality of first fins is formed on the first plate and the second plate, and an extension direction of a portion of the plurality of first fins formed on the first plate is different from an extension direction of another portion of the first fins formed on the second plate.

10. The projector of claim 9, wherein the heat dissipation device further comprises a locking member, the heat conduction member comprises a bracket fixed on the cylinder, the bracket comprises a through hole, the first substrate of the first fin structure comprises a screw hole, and the locking member penetrates through the through hole of the bracket and is fixed to the screw hole of the first substrate so as to fix the first fin structure to the heat conduction member.

* * * * *